United States Patent
Sun et al.

(10) Patent No.: US 11,876,347 B2
(45) Date of Patent: Jan. 16, 2024

(54) BROADBAND TUNING SYSTEM AND METHOD

(71) Applicant: INSTITUTE OF SEMICONDUCTORS, CHINESE ACADEMY OF SCIENCES, Beijing (CN)

(72) Inventors: Wenhui Sun, Beijing (CN); Wei Chen, Beijing (CN); Nuannuan Shi, Beijing (CN); Ninghua Zhu, Beijing (CN); Ming Li, Beijing (CN); Xin Wang, Beijing (CN); Jinhua Bai, Beijing (CN); Haiqing Yuan, Beijing (CN); Wei Li, Beijing (CN); Yu Liu, Beijing (CN)

(73) Assignee: INSTITUTE OF SEMICONDUCTORS, CHINESE ACADEMY OF SCIENCES, Beijing (CN)

(*) Notice: Subject to any disclaimer, the term of this patent is extended or adjusted under 35 U.S.C. 154(b) by 218 days.

(21) Appl. No.: 17/136,379

(22) Filed: Dec. 29, 2020

(65) Prior Publication Data
US 2021/0281044 A1    Sep. 9, 2021

(30) Foreign Application Priority Data
Jan. 2, 2020   (CN) .......................... 202010003695.4

(51) Int. Cl.
*H01S 5/068*  (2006.01)
*H01S 5/026*  (2006.01)
(Continued)

(52) U.S. Cl.
CPC ............ *H01S 5/068* (2013.01); *H01S 5/0064* (2013.01); *H01S 5/026* (2013.01);
(Continued)

(58) Field of Classification Search
CPC .... H01S 5/125; H01S 5/06256; H01S 5/4031; H01S 5/4087; H01S 5/4012;
(Continued)

(56) References Cited

U.S. PATENT DOCUMENTS

| | | | | |
|---|---|---|---|---|
| 5,384,797 A | * | 1/1995 | Welch | H01S 5/4031 |
| | | | | 372/50.12 |
| 5,784,183 A | * | 7/1998 | Aoki | H01S 5/4031 |
| | | | | 398/79 |

(Continued)

FOREIGN PATENT DOCUMENTS

| | | |
|---|---|---|
| CN | 1346527 A | 4/2002 |
| CN | 1428018 A | 7/2003 |

(Continued)

OTHER PUBLICATIONS

First Office Action for Chinese Application No. 202010003695.4, dated Oct. 12, 2020, 13 pages including English translation.

*Primary Examiner* — Joshua King
(74) *Attorney, Agent, or Firm* — Christopher R. Christenson; Kelly, Holt & Christenson PLLC

(57) ABSTRACT

A broadband tuning system includes a first chip and a second chip. The first chip includes a first light amplification region, a first forward grating region and a first backward grating region that are sequentially arranged in a first direction. The first light amplification region is configured to amplify a first light source and to turn on or turn off the first light source, and the first forward grating region and the first backward grating region are configured to tune the first light source. The second chip includes a second light amplification region, a second forward grating region and a second backward grating region that are sequentially arranged in a second direction. The second light amplification region is configured to amplify a second light source and to turn on or turn off the second light source, and the second forward (Continued)

grating region and the second backward grating region are configured to tune the second light source.

8 Claims, 2 Drawing Sheets

(51) Int. Cl.
*H01S 5/40* (2006.01)
*H01S 5/0625* (2006.01)
*H01S 5/125* (2006.01)
*H01S 5/00* (2006.01)

(52) U.S. Cl.
CPC ........ *H01S 5/06256* (2013.01); *H01S 5/4012* (2013.01); *H01S 5/4087* (2013.01); *H01S 5/125* (2013.01); *H01S 5/4031* (2013.01)

(58) Field of Classification Search
CPC ....... H01S 5/4025–4093; H01S 5/0064; H01S 5/40–4093; H01S 5/12–125; H01S 5/0233–02385; H01S 5/0265
See application file for complete search history.

(56) References Cited

U.S. PATENT DOCUMENTS

| | | | | |
|---|---|---|---|---|
| 6,088,377 A * | 7/2000 | Matsuda | | H01S 5/12 372/50.12 |
| 6,275,317 B1 * | 8/2001 | Doerr | | H04B 10/505 398/201 |
| 7,573,928 B1 * | 8/2009 | Pezeshki | | H01S 5/0265 372/43.01 |
| 9,136,666 B1 * | 9/2015 | Norberg | | H01S 5/0687 |
| 10,084,285 B1 * | 9/2018 | Wang | | H01S 5/18361 |
| 10,763,645 B2 * | 9/2020 | Shang | | H01S 5/042 |
| 2001/0026570 A1 | 10/2001 | Hisanaga | | H01S 5/4031 372/45.01 |
| 2002/0097766 A1 * | 7/2002 | Tsukiji | | B82Y 20/00 372/50.22 |
| 2002/0186730 A1 * | 12/2002 | Garbuzov | | H01S 5/4031 372/75 |
| 2003/0086174 A1 * | 5/2003 | Wakisaka | | H01S 5/12 359/566 |
| 2003/0099425 A1 * | 5/2003 | Grubb | | H04B 10/25 359/344 |
| 2003/0161570 A1 * | 8/2003 | Paniccia | | G02F 1/2257 385/37 |
| 2004/0076199 A1 * | 4/2004 | Wipiejewski | | H01S 5/0265 372/26 |
| 2005/0111773 A1 * | 5/2005 | Verdiell | | H01S 5/4031 385/14 |
| 2005/0243874 A1 * | 11/2005 | Paoletti | | H01S 5/50 372/20 |
| 2007/0153845 A1 * | 7/2007 | Bernasconi | | H01S 5/0687 372/18 |
| 2008/0138088 A1 * | 6/2008 | Welch | | H04B 10/506 398/183 |
| 2010/0092175 A1 * | 4/2010 | Kim | | H01S 5/0608 359/344 |
| 2011/0158272 A1 * | 6/2011 | Pezeshki | | H01S 5/4087 372/38.02 |
| 2011/0216792 A1 * | 9/2011 | Chann | | H01S 5/405 372/31 |
| 2011/0293279 A1 * | 12/2011 | Lam | | H04J 14/02 398/79 |
| 2012/0105968 A1 * | 5/2012 | Chann | | G02B 27/0905 359/634 |
| 2012/0230361 A1 * | 9/2012 | Adachi | | H01S 5/18 372/45.01 |
| 2013/0039374 A1 * | 2/2013 | Lutgen | | H01S 5/02253 372/43.01 |
| 2013/0044772 A1 * | 2/2013 | Ensher | | H01S 5/4087 372/20 |
| 2013/0182731 A1 * | 7/2013 | Whitbread | | H01S 3/13 372/20 |
| 2013/0315599 A1 * | 11/2013 | Lam | | H04J 14/02 398/79 |
| 2015/0093115 A1 * | 4/2015 | Uchiyama | | H01S 5/0265 398/82 |
| 2015/0098127 A1 * | 4/2015 | Kurokawa | | H04B 10/50 359/484.03 |
| 2015/0303645 A1 * | 10/2015 | Palese | | G02B 3/0037 359/341.1 |
| 2016/0134082 A1 * | 5/2016 | Li | | H01S 5/4087 372/20 |
| 2017/0279246 A1 * | 9/2017 | Muendel | | B23K 26/0876 |
| 2018/0026425 A1 * | 1/2018 | Usuda | | H01S 5/143 372/32 |
| 2018/0090576 A1 * | 3/2018 | Kim | | H01S 5/028 |
| 2018/0106963 A1 * | 4/2018 | Otani | | H01S 3/10 |
| 2018/0123695 A1 * | 5/2018 | Kubota | | G02B 6/43 |
| 2018/0278019 A1 * | 9/2018 | Yamauchi | | H01S 5/026 |
| 2018/0278020 A1 * | 9/2018 | Nakajima | | H01S 5/02326 |
| 2019/0036293 A1 * | 1/2019 | Kobayashi | | H01S 5/0683 |
| 2019/0089130 A1 * | 3/2019 | Oyu | | H01S 5/4062 |
| 2019/0158209 A1 * | 5/2019 | Lin | | G02B 6/136 |
| 2019/0214786 A1 * | 7/2019 | Whitmore | | H01S 5/4031 |
| 2019/0229492 A1 * | 7/2019 | Cha | | H01S 5/0265 |
| 2019/0267777 A1 * | 8/2019 | Kyoto | | H01S 3/08 |
| 2019/0305517 A1 * | 10/2019 | Dejima | | G02B 5/0278 |
| 2020/0088959 A1 * | 3/2020 | Sato | | H01S 5/4012 |

FOREIGN PATENT DOCUMENTS

| | | | | |
|---|---|---|---|---|
| CN | 102891433 A | | 1/2013 | |
| CN | 107078460 A | | 8/2017 | |
| CN | 107078462 A | | 8/2017 | |
| CN | 110265868 A | * | 9/2019 | .......... G02F 1/3501 |
| CN | 111326952 A | * | 6/2020 | |
| JP | 2003017803 A | * | 1/2003 | ......... H01S 5/06256 |
| JP | 6293385 B1 | * | 3/2018 | ............. G02B 27/10 |
| JP | 6366864 B1 | * | 8/2018 | ............. G02B 27/283 |
| WO | WO-0211254 A2 | * | 2/2002 | ........ H01S 5/06256 |
| WO | WO-2006097531 A1 | * | 9/2006 | ........ G02B 19/0014 |
| WO | WO-2017135381 A1 | * | 8/2017 | ............. G02F 1/025 |
| WO | WO-2020107315 A1 | * | 6/2020 | ............ H01S 5/0261 |

* cited by examiner

BROADBAND TUNING SYSTEM AND METHOD

TECHNICAL FIELD

The present disclosure relates to the field of photoelectron packaging, and specifically to a broadband tuning system and method.

BACKGROUND

As social informatization is gradually developing, performances and safety requirements of optical network infrastructures are becoming higher and higher for emerging applications represented by 5G mobile internet, 4K/8K high-definition video, Virtual Reality (VR)/Augmented Reality (AR), data centre cloud service and industrial internet. From a development process of a long-distance WDM (wavelength division multiplexing) optical transmission system, an improvement of a system capacity is mostly obtained by finely dividing time, intensity, phase and polarization dimensions of an optical signal with keeping a channel interval unchanged at 50 GHz. When a channel speed is increased to 400 G, a bandwidth of a photoelectric device and a conversion rate of an analog-digital converter are limited, a device cost is increased sharply, and a high-level modulation format has reduced tolerance to intensity noise and phase noise, and limited transmission performance, thus the above mode is difficult to be implemented.

For a practical application of the WDM transmission system, a limitation of a tunable light source, an increase in bandwidth and an increase in capacity may be considered. In recent years, how to implement a light source which may scan in a wide-range wavelength within C+L band has become a difficulty for researchers. A size of an optical transmission module in a communication system is limited, so that it is a huge challenge for a single module to implement wide-range tuning and fast switching.

SUMMARY

(I) Technical Problem to be Solved

The present disclosure provides a broadband tuning system and method, which are used to at least implement optical amplification and fast wavelength switching of light within C+L band.

(II) Technical Solutions

A broadband tuning system is provided, including a first chip and a second chip, the first chip and the second chip being arranged symmetrically about a symmetry axis, wherein, the first chip includes a first light amplification region, a first forward grating region and a first backward grating region that are sequentially arranged in a first direction, wherein the first light amplification region is configured to amplify a first light source and to turn on or turn off the first light source, and the first forward grating region and the first backward grating region are configured to tune the first light source; the second chip includes a second light amplification region, a second forward grating region and a second backward grating region that are sequentially arranged in a second direction, wherein the second light amplification region is configured to amplify a second light source and to turn on or turn off the second light source, and the second forward grating region and the second backward grating region are configured to tune the second light source; and the second direction is parallel to the first direction.

Optionally, the broadband tuning system further includes: a first optical lens, a second optical lens, an optical isolator, a third optical lens and an optical fiber, wherein the first optical lens and the second optical lens are arranged symmetrically about the symmetry axis, and the optical isolator, the third optical lens and the optical fiber are sequentially arranged on an extension line of the symmetry axis.

Optionally, a length of each of the optical isolator and the third optical lens is N times a length of the first optical lens, and N is an integer and equal to or more than two.

Optionally, the first chip further includes: a first modulator, a first gain region and a first phase region, and the second chip further includes: a second modulator, a second gain region, and a second phase region, wherein the first modulator, the first light amplification region, the first forward grating region, the first gain region, the first phase region, and the first backward grating region are sequentially connected in the first direction; and wherein the second modulator, the second light amplification region, the second forward grating region, the second gain region, the second phase region, and the second backward grating region are sequentially connected in the second direction.

Optionally, the first optical lens is arranged between the first chip and the optical isolator, and the second optical lens is arranged between the second chip and the optical isolator; and the first optical lens is arranged on an extension line of the first direction, and the second optical lens is arranged on an extension line of the second direction.

Optionally, the system further includes a substrate, and the first chip and the second chip are arranged on the substrate.

A broadband tuning method is further provided, including: S1, tuning the first light source through the first forward grating region, the first backward grating region and the first phase region to obtain a tuned first light source, and tuning the second light source through the second forward grating region, the second backward grating region and the second phase region to obtain a tuned second light source; S2, amplifying the tuned first light source in the step S1 and turning on or turning off the tuned first light source by the first light amplification region, and amplifying the tuned second light source in the step S and turning on or turning off the tuned second light source by the second light amplification region; S3, gathering light, that is output by the amplified first light source and the amplified second light source in the step S2, by the first optical lens and the second optical lens, respectively, so that the gathered light output by two light sources passes through the optical isolator and the third optical lens; and S4, coupling the light output by the two light sources and converged in the step S3 into the optical fiber.

Optionally, the step S1 includes: tuning the first light source within a first tuning range by the first forward grating region together with the first backward grating second tuning range by the second forward grating region together with the second backward grating region to obtain a firstly-tuned second light source; and tuning the firstly-tuned first light source within a third tuning range by the first phase region to obtain the tuned first light source, and tuning the firstly-tuned second light source within a fourth tuning range by the second phase region to obtain the tuned second light source.

Optionally, the first tuning range is greater than the third tuning range, and the second tuning range is greater than the fourth tuning range.

Optionally, in the step S2, the step of turning on or turning off the tuned first light source includes: setting a threshold current; controlling a magnitude of a current passing through the first light amplification region and the second light amplification region; and if the current is greater than the threshold current, turning on the first light source and turning off the second light source; otherwise, turning off the first light source and turning on the second light source.

(III) Advantageous Effects

1. The first forward grating region and the first backward grating region in the first chip, as well as the second forward grating region and the second backward grating region in the second chip may simultaneously tune a C-band with the frequency of 1529.16-1567.13 nm and a L-band with the frequency of 1570.01-1610.06 nm in wide range.
2. The first light amplification region in the first chip and the second light amplification region in the second chip may amplify the first light source and the second light source, respectively.
3. The first optical amplifier region in the first chip may control an on-off state of an optical path of the C-band, and the second optical amplifier region in the second chip may control an on-off state of an optical path of the L-band.
4. The optical isolator and the third optical lens may converge light output by the first light source and the second light source, and couple light of the C-band and the L-band.

Figure 1:
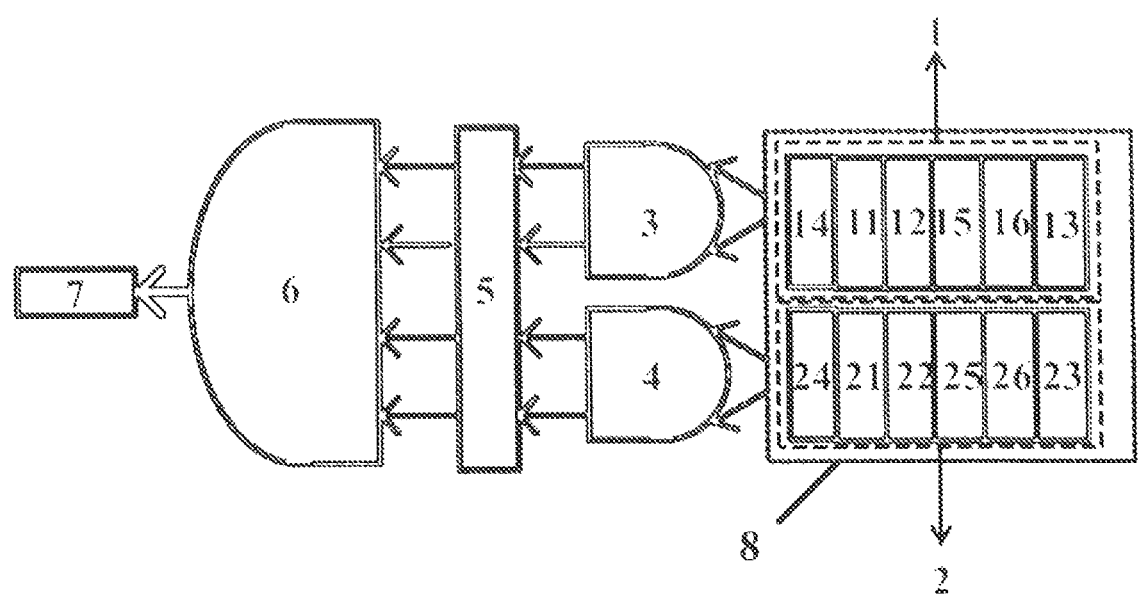
FIG. 1 schematically illustrates a diagram of a structure of a broadband tuning system according to some embodiments of the present disclosure.
Figure 2:
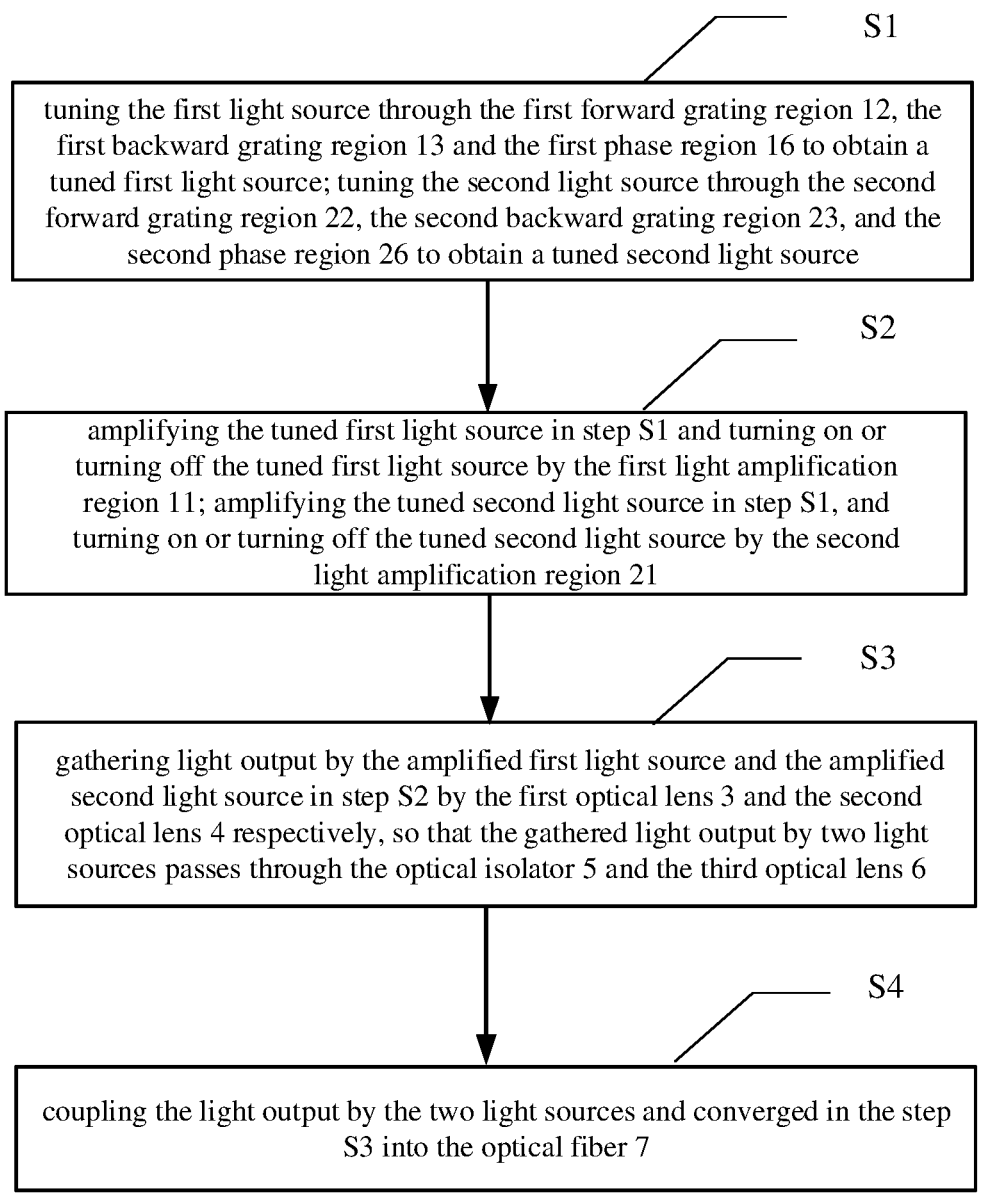
FIG. 2 schematically illustrates a flowchart of a broadband light tuning method according to some embodiments of the present disclosure.

Description of reference numerals: 1—first chip; 11—first light amplification region; 12—first forward grating region; 13—first backward grating region; 14—first modulator; 15—first gain region; 16—first phase region; 2—second chip; 21—second light amplification region; 22—second forward grating region; 23—second backward grating region; 24—second modulator; 25—second gain region; 26—second phase region; 3—first optical lens; 4—second optical lens; 5—optical isolator; 6—third optical lens; 7—optical fiber.

DETAILED DESCRIPTION OF EMBODIMENTS

In order to make objects, technical solutions and advantages of the present disclosure more clear, the technical solutions of the present disclosure will be clearly and completely described in conjunction with embodiments of the present disclosure and with reference to drawings.

Referring to FIG. 1, FIG. 1 schematically illustrates a diagram of a structure of a broadband tuning system according to some embodiments of the present disclosure.

The embodiments of the present disclosure provides a broadband tuning system, including: a first chip 1 and a second chip 2. The first chip 1 and the second chip 2 are symmetrically arranged about a symmetry axis.

In the embodiments of the present disclosure, the first chip 1 includes a first light amplification region 11, a first forward grating region 12, and a first backward grating region 13 that are sequentially arranged in a first direction. The first light amplification region 11 is configured to amplify a first light source and to turn on or turn off the first light source. The first forward grating region 12 together with the first backward grating region 13 are configured to tune the first light source.

In the embodiments of the present disclosure, the second chip 2 includes a second light amplification region 21, a second forward grating region 22, and a second backward grating region 23 that are sequentially arranged in a second direction. The second light amplification region 21 is configured to amplify a second light source and to turn on or turn off the second light source. The second forward grating region 22 together with the second backward grating region 23 are configured to tune the second light source. In the embodiments of the present disclosure, the second direction is parallel to the first direction.

In the embodiments of the present disclosures, the first forward grating region 12 and the first backward grating region 13 are configured to tune the first light source in wide range, and the second forward grating region 22 and the second backward grating region 23 are configured to tune the second light source in wide range.

In the embodiments of the present disclosure, the first chip 1 and the second chip 2 may be, for example, a Distributed Bragg Reflector (DBR) laser chip based on a quantum well structure or a quantum dot structure, a Sampled Grating Distributed Bragg Reflector (SG-DBR), a Standard Signal Generator-Distributed Bragg Reflector (SSG-DBR), and a grating-coupled sampled laser chip.

In the embodiments of the present disclosure, the first light amplification region 11 and the second light amplification region 21 are configured to optically amplify the laser light generated by the laser chip, and to implement a function of an optical switch. The first light amplification region 11 and the second light amplification region 21 have the same material and structure as a first gain region 15 and a second gain region 25. By setting a threshold current, a magnitude of a current passing through the first light amplification region 11 and the second light amplification region 21 may be controlled, so that the function of an optical switch for the laser may be implemented. If the magnitude of the current is greater than the threshold current, the first light source is turned on, and the second light source is turned off; if the magnitude of the current is smaller than the threshold current, the second light source is turned on, and the first light source is turned off.

In the embodiments of the present disclosure, the first forward grating region 12 and the second forward grating region 22 are configured to tune the tunable wavelength for the emission chip in wide range, wherein the tunable wavelength includes a C-band with a frequency of 1529.16-1567.13 nm and an L-band with a frequency of 1570.01-1610.06 nm. Currents loaded in the first forward grating region 12 and the second forward grating region 22 are controlled by an algorithm, so as to track a cavity mode and avoid a mode modulation of an output wavelength of the laser.

In the embodiments of the present disclosure, the first backward grating region 13 and the second backward grating region 23 are configured to be combined with the first forward grating region 12 and the second forward grating region 22, respectively, so as to jointly implement a vernier effect and implement a wide-range tuning of a laser wavelength.

Referring again to FIG. 1, the first chip 1 further includes: a first modulator 14, a first gain region 15 and a first phase region 16; the second chip 2 further includes: a second modulator 24, a second gain region 25, and a second phase region 26. The first modulator 14, the first light amplification region 11, the first forward grating region 12, the first gain region 15, the first phase region 16 and the first backward grating region 13 are sequentially arranged in the first direction. The second modulator 24, the second light amplification region 21, the first forward grating region 12, the second gain region 25, the second phase region 26, and the second backward grating region 23 are sequentially arranged in the second direction.

In the embodiments of the present disclosure, the first modulator 14 and the second modulator 24 are used for high-frequency modulation of the output light of the semiconductor laser.

In the embodiments of the present disclosure, the first gain region 15 and the second gain region 25 are configured to recombine carriers and emit laser light. The first gain region 15 and the second gain region 25 recombine carriers and emit laser light through the material and structure provided in these regions. For example, the material provided in the first gain region 15 and the second gain region 25 may be quantum dots or quantum well structures.

In the embodiments of the present disclosure, the first phase region 16 and the second phase region 26 are configured to finely tune a wavelength output by the semiconductor laser chip. The magnitude of the current passing through the first phase region 16 and the second phase region 26 may be controlled to finely tune the wavelength output by the semiconductor laser chip.

The system in the embodiments of the present disclosure further includes: a first optical lens 3, a second optical lens 4, an optical isolator 5, a third optical lens 6, and an optical fiber 7. The first optical lens 3 and the second optical lens 4 are symmetrically arranged about the symmetry axis. The optical isolator 5, the third optical lens 6, and the optical fiber 7 are sequentially arranged on an extension line of the symmetry axis.

In the embodiments of the present disclosure, a length of the optical isolator 5 and a length of the third optical lens 6 are N times a length of the first optical lens 3, wherein N is an integer and equal to or more than two. A size of the first optical lens 3 is the same as a size of the second optical lens 4. The first optical lens 3 is arranged between the first chip 1 and the optical isolator 5, and the second optical lens 4 is arranged between the second chip 2 and the optical isolator 5. The first optical lens 3 is arranged on an extension line of the first direction, and the second optical lens 4 is arranged on an extension line of the second direction. The system further includes a substrate 8, the first chip 1 and the second chip 2 are arranged on the substrate 8.

In the embodiments of the present disclosure, the first optical lens 3 and the second optical lens 4 are configured to gather beams of the laser light output by the first chip 1 and the second chip 2, respectively. The optical isolator 5 is configured to isolate the laser light unidirectionally to obtain unidirectional parallel light, so that the first light source is optically isolated from the second light source. The third optical lens 6 is configure to converge two unidirectional parallel light beams output by the optical isolator 5, wherein the two unidirectional parallel light beams are converged at equal power. The system further includes an optical fiber 7, and the laser light converged by the third optical lens 6 is spatially coupled into the optical fiber 7 to be transmitted in the optical fiber 7. An end face of the optical fiber 7 is parallel to an end face of the third optical lens 6.

The system in the embodiments of the present disclosure, for example, may meet the broadband requirement in backbone network transmission of 100 G and 400 G, and implement a miniaturized and integrated broadband tuned optical transmitting module. The first chip 1 and the second chip 2 in the system may respectively implement tuning range of the C-band and the L-band through cutting and optimization of energy band structures. The first optical lens 3, the second optical lens 4, the optical isolator 5, and the third optical lens 6 may implement a new type of optical coupling. Moreover, in order to meet the requirement of a channel switching function with wide speed error-free in optical communication, the first optical amplification region 11 and the second optical amplification region 21 are provided in the system, and the first optical amplification region 11 and the second optical amplification region 21 may be controlled by an algorithm to implement the functions of optical switch and power equalization. In order to meet the requirement of high-speed transmission, the first modulator 14 and the second modulator 24 are provided in the system, to load the high-speed signal to be transmitted onto the wavelength output by the laser for long-distance or short-distance transmission.

The embodiments of the present disclosure also provides a broadband tuning method, which includes the following steps.

In S1, the first light source is tuned through the first forward grating region 12, the first backward grating region 13 and the first phase region 16 to obtain a tuned first light source, and the second light source is tuned through the second forward grating region 22, the second backward grating region 23 and the second phase region 26 to obtain a tuned second light source.

Specifically, the first forward grating region 12 together with the first backward grating region 13 tune the first light source within a first tuning range to obtain a firstly-tuned first light source, and the second forward grating region 22 together with the second backward grating region 23 tune the second light source within a second tuning range to obtain a firstly-tuned second light source. The first phase region 16 tunes the firstly-tuned first light source within a third tuning range to obtain the tuned first light source, and the second phase region 26 tunes the firstly-tuned second light source within a fourth tuning range to obtain the tuned second light source.

In the embodiments of the present disclosure, the first tuning range is greater than the third tuning range, and the second tuning range is greater than the fourth tuning range.

In S2, the first light amplification region 11 amplifies the tuned first light source in the step S1 and turns on or turns off the tuned first light source, and the second light amplification region 21 amplifies the tuned second light source in the step S1 and turns on or turns off the tuned second light source.

In S3, the first optical lens 3 and the second optical lens 4 gather light output by the amplified first light source and the amplified second light source in the step S2, respectively, so that the gathered light output by the first light source and the second light source may pass through the optical isolator 5 and the third optical lens 6.

In S4, light beams converged in the step S3 and output by the two light sources are coupled into the optical fiber 7.

In the step S2 in the embodiments of the present disclosure, the step of turning on or turning off the tuned first light source includes: setting a threshold current; controlling the magnitude of the current passing through the first light amplification region 11 and the second light amplification region 21; if the current is greater than the threshold current, turning on the first light source and turning off the second light source; otherwise, turning off the first light source and turning on the second light source.

Through the above-mentioned embodiments, the objectives, technical solutions and advantages of the present disclosure have been described in details. It is to be understood that the above-mentioned embodiments are only detailed embodiments of the present disclosure, and are not intended to limit the present disclosure. Any modifications, equivalents, improvements and the like made within the spirit and principle of the present disclosure should be included in the protection scope of the present disclosure.

What is claimed is:

1. A broadband tuning system, comprising a first chip and a second chip, the first chip and the second chip being arranged symmetrically about a symmetry axis, wherein,
    the first chip comprises a first light amplification region, a first forward grating region and a first backward grating region that are sequentially arranged in a first direction, wherein the first light amplification region is configured to amplify a first light source and to turn on or turn off the first light source, and the first forward grating region and the first backward grating region are configured to tune the first light source;
    the second chip comprises a second light amplification region, a second forward grating region and a second backward grating region that are sequentially arranged in a second direction, wherein the second light amplification region is configured to amplify a second light source and to turn on or turn off the second light source, and the second forward grating region and the second backward grating region are configured to tune the second light source;
    the second direction is parallel to the first direction; and
    the first forward grating region and the first backward grating region are tuned such that during operation the first chip emits in a C-band with a frequency of 1529.16-1567.13 nm, and the second forward grating region and the second backward grating region are tuned such that during operation the second chip emits in a L-band with a frequency of 1570.01-1610.06 nm,
    wherein the broadband tuning system further comprises:
    a first optical lens, a second optical lens, an optical isolator, a third optical lens and an optical fiber,
    wherein the third optical lens is configured to converge light output by the first light source and the second light source, and couple light of the C-band and the L-band,
    wherein a length of each of the optical isolator and the third optical lens is N times a length of the first optical lens, and N is an integer and equal to or more than two, so that the third optical lens converges two unidirectional parallel light beams output by the optical isolator at equal power,
    wherein the first chip further comprises: a first modulator, a first gain region and a first phase region, and the second chip further comprises: a second modulator, a second gain region, and a second phase region, wherein the first modulator, the first light amplification region, the first forward grating region, the first gain region, the first phase region, and the first backward grating region are sequentially connected in the first direction, wherein the second modulator, the second light amplification region, the second forward grating region, the second gain region, the second phase region, and the second backward grating region are sequentially connected in the second direction,
    wherein the first modulator and the second modulator are configured for high-frequency modulation of an output light of the first light source and the second light source, respectively, so that the first chip and the second chip emit in the C-band and the L-band.

2. The broadband tuning system of claim 1, wherein the first optical lens and the second optical lens are arranged symmetrically about the symmetry axis, and the optical isolator, the third optical lens and the optical fiber are sequentially arranged on an extension line of the symmetry axis.

3. The broadband tuning system of claim 2, wherein the first optical lens is arranged between the first chip and the optical isolator, and the second optical lens is arranged between the second chip and the optical isolator; and
    the first optical lens is arranged on an extension line of the first direction, and the second optical lens is arranged on an extension line of the second direction.

4. The broadband tuning system of claim 1, wherein the system further comprises a substrate, and the first chip and the second chip are arranged on the substrate.

5. A broadband tuning method, comprising:
    S1, tuning first light source through a first forward grating region, a first backward grating region and a first phase region to obtain a tuned first light source, and tuning a second light source through a second forward grating region, a second backward grating region and a second phase region to obtain a tuned second light source;
    S2, amplifying the tuned first light source in the step S1 and turning on or turning off the tuned first light source by a first light amplification region, and amplifying the tuned second light source in the step S1 and turning on or turning off the tuned second light source by a second light amplification region;
    S3, gathering light, that is output by an amplified first light source and an amplified second light source in the step S2, by a first optical lens and a second optical lens, respectively, so that the gathered light output by two light sources passes through an optical isolator and a third optical lens; and
    S4, coupling the light output by the amplified first light source and the amplified second light source and converged in the step S3 into an optical fiber; and
    wherein the first forward grating region and the first backward grating region are tuned such that during operation a first chip emits in a C-band with a frequency of 1529.16-1567.13 nm, the second forward grating region and the second backward grating region are tuned such that during operation a second chip emits in a L-band with a frequency of 1570.01-1610.06 nm in wide range,
    wherein the third optical lens is configured to converge light output by the first light source and the second light source, and couple light of the C-band and L-band,
    wherein a length of each of the optical isolator and the third optical lens is N times a length of the first optical lens, and N is an integer and equal to or more than two, so that the third optical lens converges two unidirectional parallel light beams output by the optical isolator at equal power, wherein the first chip further comprises: a first modulator and a first gain region, and the second chip further comprises: a second modulator and a second gain region, wherein the first modulator, the first light amplification region, the first forward grating region, the first gain region, the first phase region, and the first backward grating region are sequentially connected in a first direction, wherein the second modulator, the second light amplification region, the second forward grating region, the second gain region, the second phase region, and the second backward grating region are sequentially connected in a second direction, wherein the first modulator and the second modulator are configured for high-frequency modulation of an output light of the first light source and the second light source, respectively, so that the first chip and the second chip emit in the C-band and the L-hand.

6. The broadband tuning method of claim 5, wherein the step S1 comprises:

tuning the first light source within a first tuning range by the first forward grating region together with the first backward grating region to obtain a firstly-tuned first light source, and tuning the second light source within a second tuning range by the second forward grating region together with the second backward grating region to obtain a firstly-tuned second light source; and tuning the firstly-tuned first light source within a third tuning range by the first phase region to obtain the tuned first light source, and tuning the firstly-tuned second light source within a fourth tuning range by the second phase region to obtain the tuned second light source.

7. The broadband tuning method of claim 6, wherein the first tuning range is greater than the third tuning range, and the second tuning range is greater than the fourth tuning range.

8. The broadband tuning method of claim 5, wherein in the step S2, the step of turning on or turning off the tuned first light source comprises:

setting a threshold current;

controlling a magnitude of a current passing through the first light amplification region and the second light amplification region; and if the current is greater than the threshold current, turning on the first light source and turning off the second light source; otherwise, turning off the first light source and turning on the second light source.

* * * * *